US006781089B2

(12) United States Patent
Umetsu et al.

(10) Patent No.: US 6,781,089 B2
(45) Date of Patent: Aug. 24, 2004

(54) METHOD AND APPARATUS FOR CUTTING ELECTRICAL WIRING LINE ON A SUBSTRATE, AND METHOD AND APPARATUS FOR MANUFACTURING ELECTRONIC DEVICE

(75) Inventors: Kazushige Umetsu, Chino (JP); Jun Amako, Matsumoto (JP); Kenichi Honda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/273,422

(22) Filed: Oct. 17, 2002

(65) Prior Publication Data

US 2003/0085208 A1 May 8, 2003

(30) Foreign Application Priority Data

Oct. 24, 2001 (JP) ...................................... 2001-325814
Sep. 3, 2002 (JP) ...................................... 2002-257909

(51) Int. Cl.[7] ............................................. B23K 26/38
(52) U.S. Cl. ............................................. 219/121.68
(58) Field of Search ....................... 219/121.68, 121.69, 219/121.7, 121.71, 121.72, 121.73, 121.77, 121.67

(56) References Cited

U.S. PATENT DOCUMENTS 4,476,375 A * 10/1984 Ogawa ................... 219/121.72
5,175,504 A * 12/1992 Henley ........................ 324/501
5,851,862 A * 12/1998 Ohtani et al. ................ 438/166
6,311,583 B1 * 11/2001 Izumisawa .................. 81/57.13
6,562,698 B2 * 5/2003 Manor ......................... 438/460
2001/0035401 A1 * 11/2001 Manor .................... 219/121.72

FOREIGN PATENT DOCUMENTS

JP            01230020         9/1989

OTHER PUBLICATIONS

Patent Abstracts of Japan of JP 01230020 Dated Sep. 13, 1989.

* cited by examiner

Primary Examiner—Tom Dunn
Assistant Examiner—Jonathan Johnson
(74) Attorney, Agent, or Firm—Ladas & Parry

(57) ABSTRACT

An apparatus for cutting an electrical wiring line includes a laser generator for generating a laser beam, an optical beam branching element for branching a laser beam generated by the laser generator into a plurality of branch beams, and a condenser element for condensing the branch beams branched by the optical beam branching element (the optical beam branching element can also serve as the condenser element). The condenser element may be a condenser lens which is separate from the optical beam branching element. The power and the focal depth of the branch beam may be adjusted. When the substrate has a transparency to the laser beam, the branch beam is directed to the electrical wiring line formed on the substrate from the opposite side to the surface having the electrical wiring line.

27 Claims, 14 Drawing Sheets

METHOD AND APPARATUS FOR CUTTING ELECTRICAL WIRING LINE ON A SUBSTRATE, AND METHOD AND APPARATUS FOR MANUFACTURING ELECTRONIC DEVICE

BACKGROUND OF THE INVENTION

1. Field of the Invention

The present invention relates to a technique for cutting an electrical wiring line disposed beforehand on a substrate, and more particularly, to a technique which cuts, for isolation, electrical wiring lines one from another which have been shorted to each other to avoid static breakdown, in the manufacturing process of an electronic device such as a display device of liquid-crystal or organic electro-luminescence (EL), or a semiconductor device.

2. Description of the Related Art

Electronic devices, such as a liquid-crystal display device and a semiconductor device, are subject to a breakdown due to static in the manufacturing process thereof. To avoid a breakdown due to static electricity, predetermined electrical wiring lines on a substrate on which a driver IC is to be mounted are shorted by a shorting line until the driver IC is mounted on the substrate. Immediately prior to the mounting of the driver IC, the shorting line is cut using a laser or the like so that the electrical wiring lines are isolated from each other (See the first embodiment and FIG. 1 in Japanese Unexamined Patent Application Publication 1-230020, for example).

Since the cutting of each of the electrical wiring lines or the shorting line is carried out at one location only, the isolation of the lines from each other is not fully assured because of dirt sticking to the lines or wiring defects. To avoid such isolation failure between the lines, a cutting operation may be repeated. However, repeated cutting operations lead to prolonged process time. When a substrate bearing a plurality of liquid-crystal panels is diced to a product size, the electrical wiring lines are also cut for isolation at the same time. Such a dual-purpose operation becomes impossible, depending on the shape and the structure of the liquid-crystal panel.

SUMMARY OF THE INVENTION

Accordingly, it is an object of the present invention to provide a method and an apparatus for reliably cutting electrical wiring lines formed on a substrate to isolate one line from another in a short period of time.

It is another object of the present invention to provide a method and an apparatus which manufactures an electronic device using the method and the apparatus for cutting the electrical wiring lines.

In one aspect of the present invention, a method of cutting an electrical wiring line or a substrate includes the steps of branching a laser beam into a plurality of branch beams, and directing the plurality of branch beams to the electrical wiring line on the substrate to concurrently cut the electrical wiring line at a plurality of locations. In this way, one electrical wiring line is reliably cut for isolation, and the process efficiency of the substrate is heightened.

The electrical wiring line may be cut by relatively moving the substrate and the branch beams with respect to each other. The electrical wiring line is reliably cut even if the electrical wiring line has a wide line width or even if a plurality of electrical wiring lines need to be cut.

The branch beams may be relatively moved with respect to and perpendicularly to the electrical wiring line. With this arrangement, isolation is reliably assured because the electrical wiring lines are cut at locations according to the number of branch beams.

An angle θ may fall within a range equal to or greater than zero degree and smaller than 90 degrees where the angle θ is formed between a direction of the row of the plurality of branch beams and a direction of the electrical wiring line. In this way, the positions of cutting by the branch beams can overlap with each other, thereby assuring isolation.

The branch beams may be directed to the electrical wiring line on the substrate from the side of a surface thereof having the electrical wiring line. Alternatively, the branch beams may be directed to the electrical wiring line through the substrate from the opposite side to the surface having the electrical wiring line. Furthermore, the branch beams may be directed to the electrical wiring line through the substrate when the electrical wiring line is disposed between a plurality of substrates. To irradiate the electrical wiring line with the laser beam through the substrate, the substrate is required to have a transparency to the laser beam. Experiments show that the cutting of the electrical wiring line by the laser beam transmitted through the substrate not only saves energy more than the direct laser beam irradiation to the electrical wiring line, but also results in a cut portion neater than that resulting from the direct laser beam irradiation to the electrical wiring line.

Preferably, debris resulting from cutting of the electrical wiring line is sucked in while the electrical wiring line is cut. This arrangement prevents the debris from scattering over the substrate.

The laser beam in an infrared light region may be used. The laser beam in the infrared light region is transmitted through silicon.

The laser beam may be generated by a solid-state laser device, a harmonic oscillation of the solid-state laser device, a gas laser device or metal vapor laser device.

The atmosphere for a cutting process may have a pressure lower than the atmospheric pressure. In this arrangement, the generation of dross and debris is effectively suppressed.

The atmosphere for a cutting process may contain no oxygen, or may contain nitrogen or a noble gas. In this arrangement, oxidation of the wiring line is avoided.

The substrate may have a transparency to the laser beam. For example, the substrate may be made of glass or silicon.

A portion of the electrical wiring line to be cut may linearly extend. In this arrangement, controlling the irradiation of the electrical wiring line with the branch beams becomes easy, and process efficiency is heightened.

When electrical wiring lines formed on the substrates of a plurality of electronic devices are cut, the plurality of electronic devices may be juxtaposed to each other so that cut ends of the electrical wiring lines of the respective electronic devices are aligned in a line. In this arrangement, the branch beams are relatively and linearly moved with respect to the cut portions of the electronic devices, so that the irradiation of the electrical wiring lines with the branch beams is easily controlled, and process efficiency is heightened.

The electrical wiring line may be formed on a transparent layer. The transparent layer may be made of ITO or tantalum pentoxide. When the electrical wiring line is irradiated with the laser beam from the opposite side to the surface having the electrical wiring line, the cut area is neater in the case of the wiring line formed on the transparent layer than in the case without the transparent layer, according to the results of experiments.

The electrical wiring line may be made of chromium or ITO.

In another aspect of the present invention, a method for manufacturing an electronic device having a substrate on which a plurality of electrical wiring lines are formed, includes a step of isolating each of electrical wiring lines from another by cutting the electrical wiring lines, wherein the electrical wiring lines are cut using one of the above-referenced methods of cutting an electrical wiring line.

An IC to be connected to the electrical wiring lines may be mounted on the substrate subsequent to the cutting of the electrical wiring lines. In this arrangement, the electrical wiring lines are reliably isolated from each other.

The electronic device may be a display for example.

In yet another aspect of the present invention, an apparatus for cutting an electrical wiring line includes a laser generator for generating a laser beam, an optical beam branching element for branching the laser beam generated by the laser generator into a plurality of branch beams, and a beam condenser for condensing the branch beams branched by the optical beam branching element. A single electrical wiring line is concurrently cut at a plurality of positions, and isolation is assured. Similarly, a plurality of wiring lines are cut by relatively moving the branch beams with respect to the electrical wiring lines.

The optical beam branching element may also serve as the beam condenser.

The optical branching element may be one of an optical diffraction element and a phase grating.

The apparatus may further include a beam splitter element for splitting the laser beam generated by the laser generator into a plurality of beams, wherein the optical beam branching element is arranged at least for one split beam. In this arrangement, the process efficiency is further heightened.

The beam splitter element may be a polarizing beam splitter.

The apparatus may further include a retardation element disposed in front of the polarizing beam splitter, for adjusting a polarization plane component ratio of the beam. In this arrangement, the power of each split beam is finely adjusted.

The apparatus may further include a beam expander for adjusting the beam diameter of the beam prior to beam condensation. This arrangement allows the focal depth of the laser beam to be adjusted, thereby making adjustments to a variation in the position of the cutting operation.

The apparatus may further include a suction mechanism for sucking debris resulting from the cutting of the electrical wiring line. The scattering of the cut debris is controlled.

In a further aspect, the present invention relates to an apparatus for manufacturing an electronic device including a substrate having a plurality of electrical wiring lines to be connected with an IC mounted on the substrate. The apparatus includes a laser generator for generating a laser beam, an optical beam branching element for branching the laser beam generated by the laser generator into a plurality of branch beams, and a beam condenser for condensing the branch beams branched by the optical beam branching element, so that the plurality of electrical wiring lines which are shorted to each other are cut by the branch beams for isolation from each other and then connected with the IC.

The optical beam branching element may also serve as the beam condenser.

The apparatus may further include an IC mounter to mount the IC on the substrate.

An optical system including the laser generator, the optical beam branching element and the beam condenser may be incorporated in the IC mounter. A compact design is thus implemented in the apparatus for manufacturing an electronic device.

The laser generator may be a laser diode oscillator. A compact design is thus implemented in the laser generator.

DESCRIPTION OF THE PREFERRED EMBODIMENTS

Figure 1:
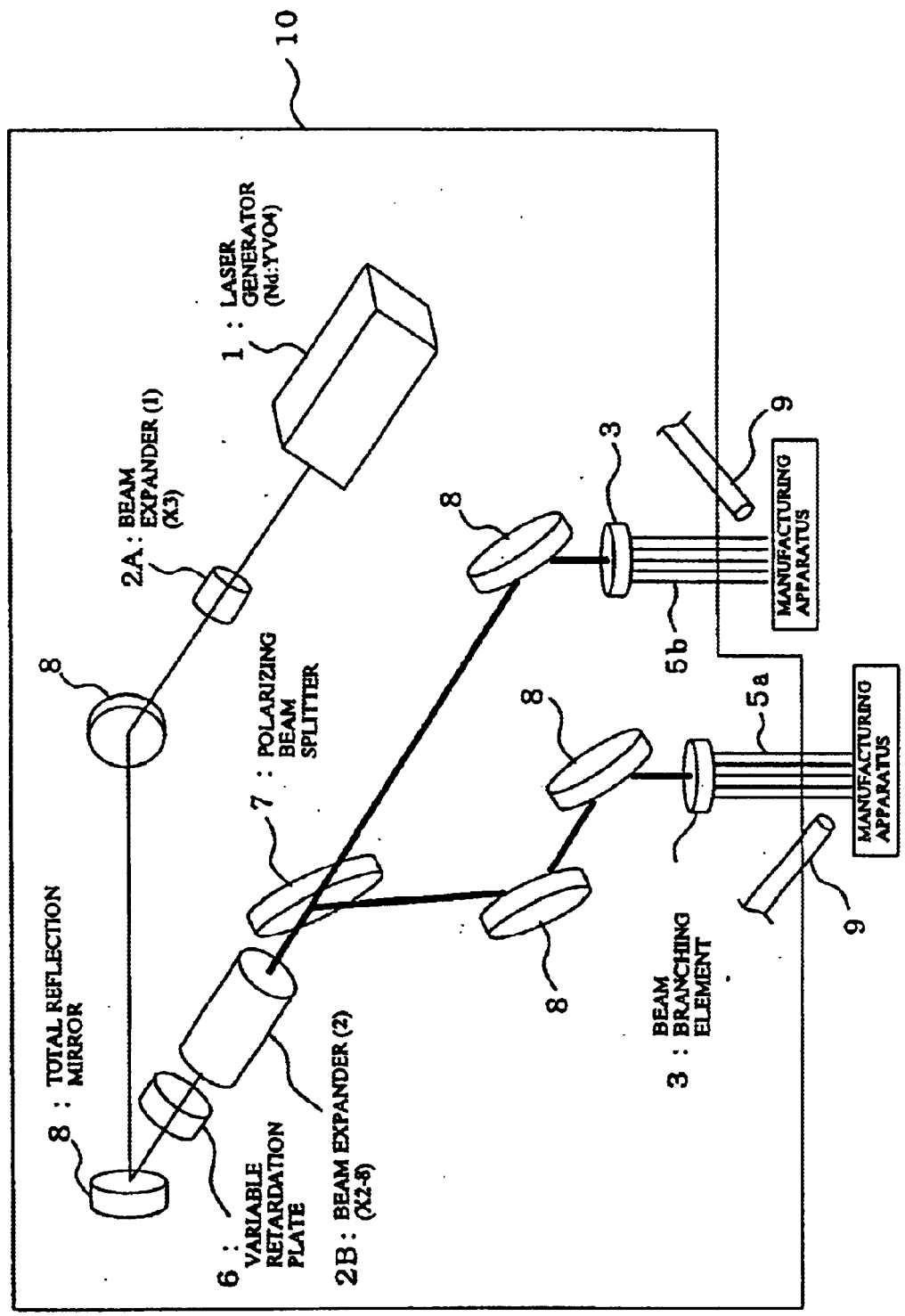
FIG. 1 is a diagram generally illustrating an optical system of a laser cutting apparatus for cutting an electrical wiring line in accordance with one embodiment of the present invention.

The present invention will now be discussed in detail. FIG. 1 is a diagram generally illustrating an optical system of a laser cutting apparatus 10 for cutting an electrical wiring line in accordance with one embodiment of the present invention. The laser cutting apparatus 10 includes a laser generator 1 as a laser light source, and an beam expander for expanding the beam diameter of a laser beam from the laser generator 1. A plurality of beam expanders having respective expansion rates may be arranged to meet required beam diameters. The laser cutting apparatus 10 includes two beam expanders 2A and 2E. The beam expander 2A expands the beam diameter by three times. The beam expander 2B variably expands the beam diameter within a range from two to eight-fold the original diameter. A variable phase element for modifying a polarization plane component ratio of the beam, such as a variable retardation plate 6 or a wavelength plate, is arranged on the light incident side of the beam expander 2B, and a polarizing beam splitter 7 for splitting the beam is arranged on the light exit side of the beam expander 2B. A beam branching element 3 is arranged at the back end of the optical system for branching a split beam into a plurality branch beams to condense and direct each branch beam.

The direction of travel of light is changed as necessary. Here, the direction of travel of light is changed by total reflection mirrors 8.

The laser cutting apparatus 10 includes a suction device for sucking in debris resulting from the cutting of the electrical wiring lines, and a suction pipe 9 of the laser cutting apparatus 10 for sucking in the debris is arranged in the vicinity of focus points of the branch beams from the beam branching element 3.

The cutting apparatus illustrated in FIG. 1 operates as described below. A laser beam is generated by the laser generator 1, and the beam diameter of the laser beam is expanded by three times by the beam expander 2A. The laser beam having the three-fold diameter is incident on the variable retardation plate 6 after being reflected from the total reflection mirror 8. The laser beam exiting from the variable retardation plate 6 becomes a beam having a polarization plane component ratio set by the variable retardation plate 6. That laser beam is then incident on the beam expander 2B. The beam diameter is further expanded. The resulting laser beam is then incident on the polarizing beam splitter 7. The polarizing beam splitter 7 splits the single incident beam into two beams by transmitting one of the s-wave component and the p-wave component and by reflecting the other of the s-wave component and the p-wave component. The two split beams are reflected from the total reflection mirrors 8 for adjustment of the direction of travel, and are then branched into a plurality of branch beams by the beam branching element 3. The branch beams 5a and 5b are then focused on the cutting process position. By placing the electrical wiring lines formed on the substrate to the focused position of each branch beam, a plurality of locations of the electrical wiring lines are concurrently fused and thus cut. During the cutting operation, the debris from the cut wiring lines is sucked by the suction pipe 9 and is sent to a waste container (not shown).

When a electrical wiring line to be cut has a wide line width or when there are a plurality of electrical wiring lines to be cut, one of the substrate and each branch beam moved so that the branch beam crosses the electrical wiring line. In this relative motion, the electrical wiring line is cut.

The electrical wiring line to be cut by the branch beam is typically made of chromium, aluminum, gold, silver, copper, tungsten, ITO, or an alloy of these metals. The application and the type of the electrical wiring line are not important in the context of this invention.

The laser cutting apparatus 10 is adjusted in the following two points.

(i) The polarization plane component ratio of the beam exiting from the variable retardation plate 6 is modified by adjusting the variable retardation plate 6. The intensities of the two beams into which the laser beam are split by the polarizing beam splitter 7 are finely adjusted so that the branch beams exiting from the beam branching element 3 become equal in intensity at irradiation positions. Even if the laser beam is split by the polarizing beam splitter 7 at an intensity ratio of 1:1, beam intensities at the irradiation positions thereof may become different due to subsequent reflection and transmission of the split beams. The component adjustment of the beam by the variable retardation plate 6 corrects the intensity difference. When no adjustment is required, the variable retardation plate 6 is dispensed with. An optical diffraction element or a phase grating may be substituted for the polarizing beam splitter 7 as a beam splitting element.

(ii) The focal depth of the branch beam is adjusted by adjusting the expansion rate of the beam expander 2B. For example, if the beam diameter of the branch beam is narrowed prior to beam condensing, the focal depth becomes large. A large focal depth increases a margin allowed for a variation in the thickness of the substrate having the electrical wiring line and a variation in the focal point arising from the inclusion of a foreign object. However, since a large focal depth leads to a large spot diameter, an increase in the focal depth is preferably adjusted within the limitations required to cover the variation in the focal point.

The laser cutting apparatus 10 may use an infrared laser, a solid-state laser, a gas laser, a metal vapor laser, for example. The laser cutting apparatus 10 a harmonic laser light of a solid-state laser may also be used in the apparatus.

The beam branching element 3 may be an optical diffraction element making use of the diffraction of light or a Fresnel-type phase grating.

Referring to FIG. 1, the beam branching element 3 has also a beam condensing function. Alternatively, the beam branching element 3 may have the beam branching function only, and then another element having a beam condensing function, such as a condenser lens, may be included.

To enhance the process efficiency, the laser beam is split into the two beams by the polarizing beam splitter 7 in the optical system. However, the beam splitting is optional. The laser beam may not necessarily be split, or be split into two or more beams, before generating branch beams. It is not a requirement that all split beams be used for cutting process even if the laser beam is split by the polarizing beam splitter 7.

The atmosphere for the cutting process of the electrical wiring line may be simply set to the atmospheric pressure. If the atmosphere for the cutting process of the electrical wiring line is lowered than the atmospheric pressure, the generation of the dross or debris is restrained.

If the atmosphere for the cutting process of the electrical wiring line contains no oxygen, the oxidation of the electrical wiring line is prevented. The atmosphere for the cutting process may consist of nitrogen or a noble gas.

The object to be cut by the laser cutting apparatus 10 will now be discussed. The object discussed here is a display, particularly, a TFD (Thin-Film Diode) liquid-crystal display.

Figure 2:
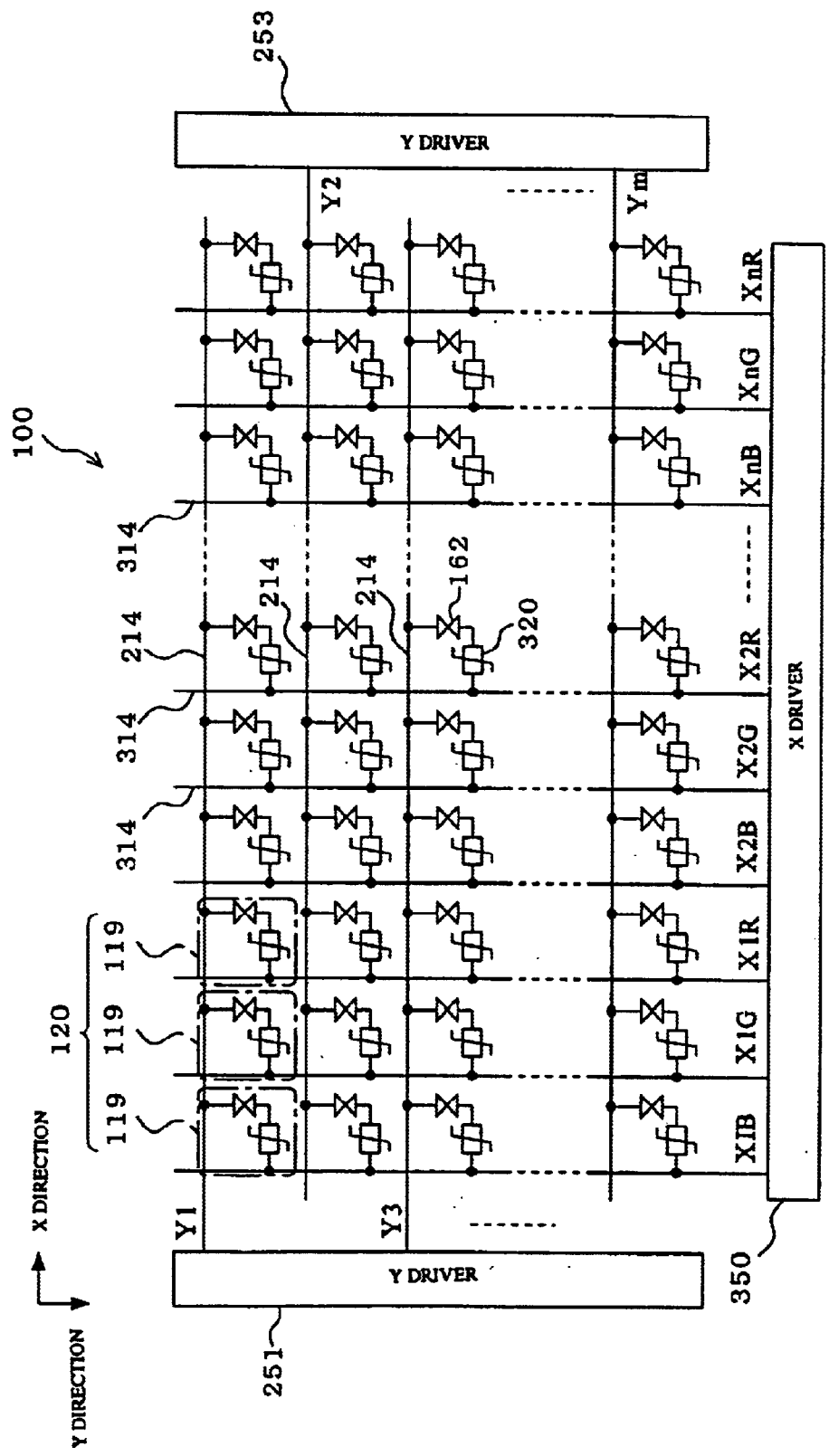
FIG. 2 is a block diagram illustrating a display which is cut by the laser cutting apparatus illustrated in FIG. 1.

FIG. 2 is a block diagram illustrating the electrical construction of a TFD liquid-crystal display 100. As shown, the display 100 includes a plurality of scanning lines 214 extending in the horizontal (X) direction, and a plurality of data lines 314 (3n lines) extending in the vertical (Y) direction. A pixel 119 is formed at each intersection of one scanning line 214 and one data line 314. The pixel 119 corresponds to one of the three colors R (red), G (green), and B (blue). Three pixels 119 of R, G, and B adjacent in the X direction form one dot 120.

Each pixel 119 includes a serial connection of a liquid crystal 162 working as a capacitor and a TFD 320 working as a switching element. The liquid crystal 162 is encapsulated between the scanning lines 214 functioning as a counter electrode and a pixel electrode made of ITO (Indium Thin Oxide). The TFD 320 is configured with one terminal thereof connected to the data line 314 and with the other terminal thereof connected to the pixel electrode, and is controlled for on and off operations in response to a voltage difference between the scanning line 214 and the data line 314.

Y drivers 251 and 253 are also referred to as a scanning line driving circuit. The Y driver 251 drives odd-numbered scanning lines 214 from the top (namely, first, third, . . . , (2m−1)-th scanning lines 214) in FIG. 2, and the Y driver 253 drives even-numbered scanning lines 214 from the top (namely, second, fourth, . . . , 2m-th scanning lines 214) in FIG. 2. In other words, the Y drivers 251 and 253 select successively and exclusively one of the first, second, . . . , 2m-th scanning lines 214 at a time within one vertical scanning period. A selected scanning line 214 is supplied with a scanning signal having a selection voltage, while non-selected scanning lines 214 are supplied with a scanning signal having a non-selection voltage.

An X driver 350 is also referred to as a data line driving circuit. The X driver 350 supplies 3n pixels 119 positioned on a scanning line 214 selected by either of the Y drivers 251 and 253 with data signals X1B, X1G, X1R, X2B, X2G, X2R, . . . , XnB, XnG, and XnR corresponding to a display content, through respective data lines 314.

Figure 3:
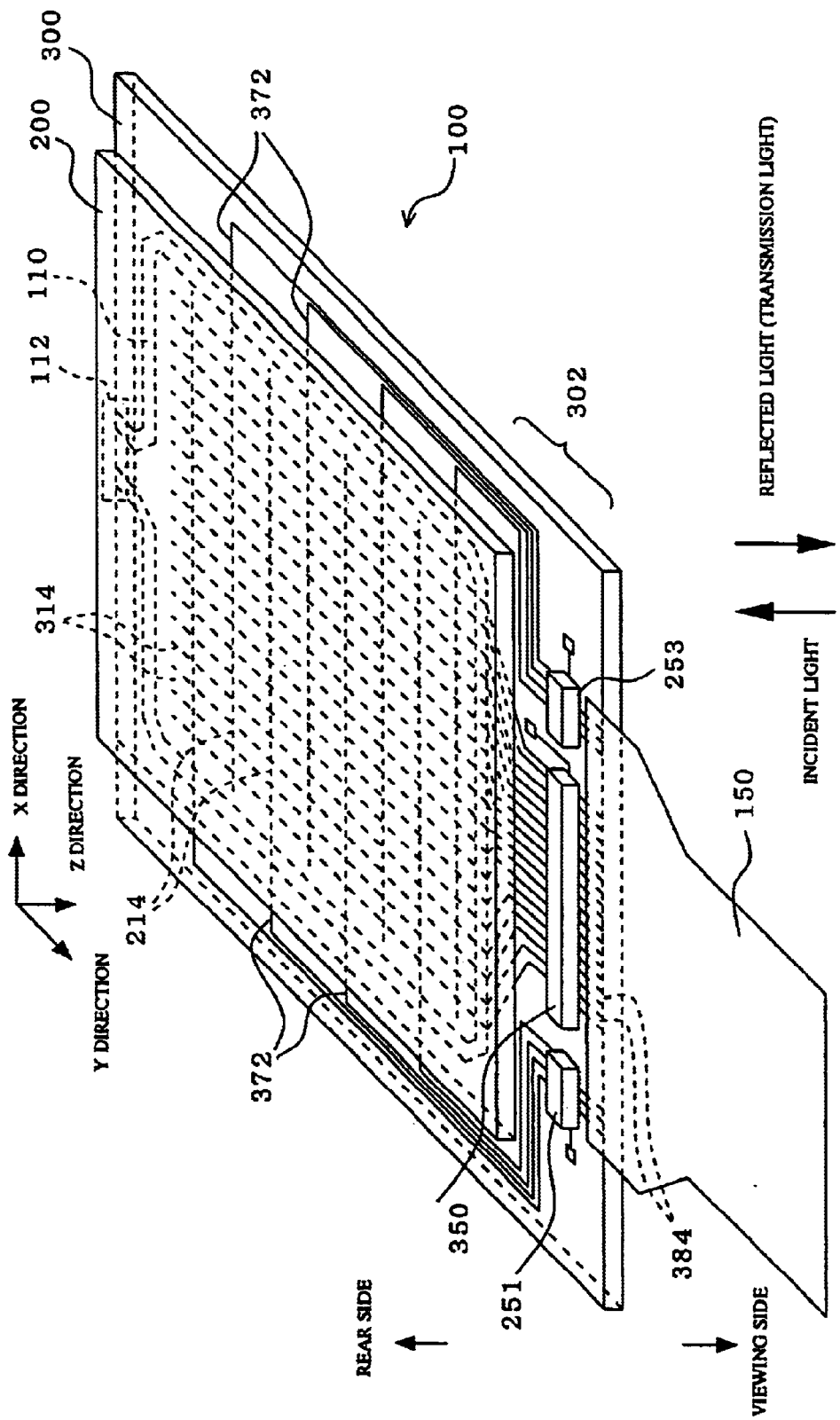
FIG. 3 is an external perspective view of the display illustrated in FIG. 2.

The mechanical construction of the display 100 is discussed below. FIG. 3 is an external perspective view of the display 100. As shown, the display 100 includes a TFD substrate 300 having TFDs formed thereon and a counter substrate 200 facing the TFD substrate 300. The TFD substrate 300 is bonded to the counter substrate 200 with a sealing member 110 interposed therebetween for maintaining a constant gap therebetween. The sealing member 110 serving as a spacer contains electrically conductive particles at an appropriate rate. A liquid crystal of TN (Twisted Nematic) type is encapsulated into the gap, for example. The sealing member 110 extends along the inside peripheral portion of the counter substrate 200. To introduce the liquid crystal, an inlet port is opened in the sealing member 110. The inlet port is closed with a seal material 112 subsequent to the encapsulation of the liquid crystal.

Arranged on the surface of the counter substrate 200 facing the TFD substrate 300 are 2m scanning lines 214 extending in the X direction. Arranged on the surface of the TFD substrate 300 facing the counter substrate 200 are 3n data lines 314 extending in the Y direction. The odd-numbered scanning lines 214 formed on the counter substrate 200 extend beyond the left side of the sealing member 110 and the even-numbered scanning lines 214 formed on the counter substrate 200 extend beyond the right side of the sealing member 110. Also arranged on the TFD substrate 300 are wiring lines 372 respectively for the scanning lines 214 on a one-to-one correspondence basis. The wiring lines 372 respectively face the ends of the scanning lines 214 in the forming region of the sealing member 110.

The electrically conductive particles are dispersed in the sealing member 110 in a manner such that at least one particle is present in the portion where the end of one scanning line 214 faces the end of corresponding one wiring line 372. Thereby, the scanning lines 214 formed on the counter substrate 200 are respectively connected to the wiring lines 372 formed on the TFD substrate 300 through the electrically conductive particles.

Among the wiring lines 372, wiring lines 372 connected to the odd-numbered scanning lines 214 are bent at about 90 degrees outside the forming region of the sealing member 110, then extend in the Y direction, and reach an extension area 302 to be then connected there to output bumps of the Y driver 251. Similarly, wiring lines 372 connected to the even-numbered scanning lines 214 are bent at about 90 degrees outside the forming region of the sealing member 110, then extend in the Y direction, and reach the extension area 302 to be then connected there to output bumps of the Y driver 253. The data lines 314 extend beyond the forming region of the sealing member 110 with a narrower line pitch, and then reach the extension area 302. The data lines 314 are then connected to output bumps of the X driver 350.

Wiring lines 384 are disposed on the extension area 302 of the TFD substrate 300. Ends of the wiring lines 384 are respectively connected to input bumps of the Y drivers 251 and 253, and the X driver 350. The other ends of the wiring lines 384 are connected to a flexible connector 150. An external circuit (not shown) supplies the Y drivers 251 and 253, and the X driver 350 with a clock signal, control signals, etc., through the flexible connector 150.

Bumps made of gold (Au) or the like are formed on electrodes in the peripheral portion of the mounting surface of the X driver 350. The X driver 350 is mounted on the extension area 302 in the following manner.

An anisotropically conductive sheet formed of an epoxy adhesive containing electrically conductive particles dispersed therewithin is disposed in an area of the TFD substrate 300 where the X driver 350 is to be mounted. The anisotropically conductive sheet is interposed between the X driver 350 with the electrode forming surface looking downward and the TFD substrate 300. After aligning the X driver 350, the X driver 350 and the TFD substrate 300 with the anisotropically conductive sheet sandwiched therebetween are subjected to pressure and heating. After cooling the assembly, the pressure is removed.

The output bumps of the X driver 350 for feeding the data signals are electrically connected to the data lines 314 through the electrically conductive particles in the adhesive, and the input bumps of the X driver 350 for inputting signals from the flexible connector 150 are electrically connected to the wiring lines 384 through the electrically conductive particles in the adhesive respectively. The adhesive not only bonds the X driver 350 but also serves as a sealing member which protects the electrode forming surface from humidity, contamination and stress. Similarly, the anisotropically electrically conductive sheet is used to mount the Y drivers 251 and 253.

To connect the flexible connector 150, the anisotropically conductive sheet is also used. An electrical wiring line formed on a base material such as polyimide in the flexible connector 150 is electrically connected to the wiring line 384 formed on the TFD substrate 300 through the electrically conductive particles in the adhesive.

Figure 4:
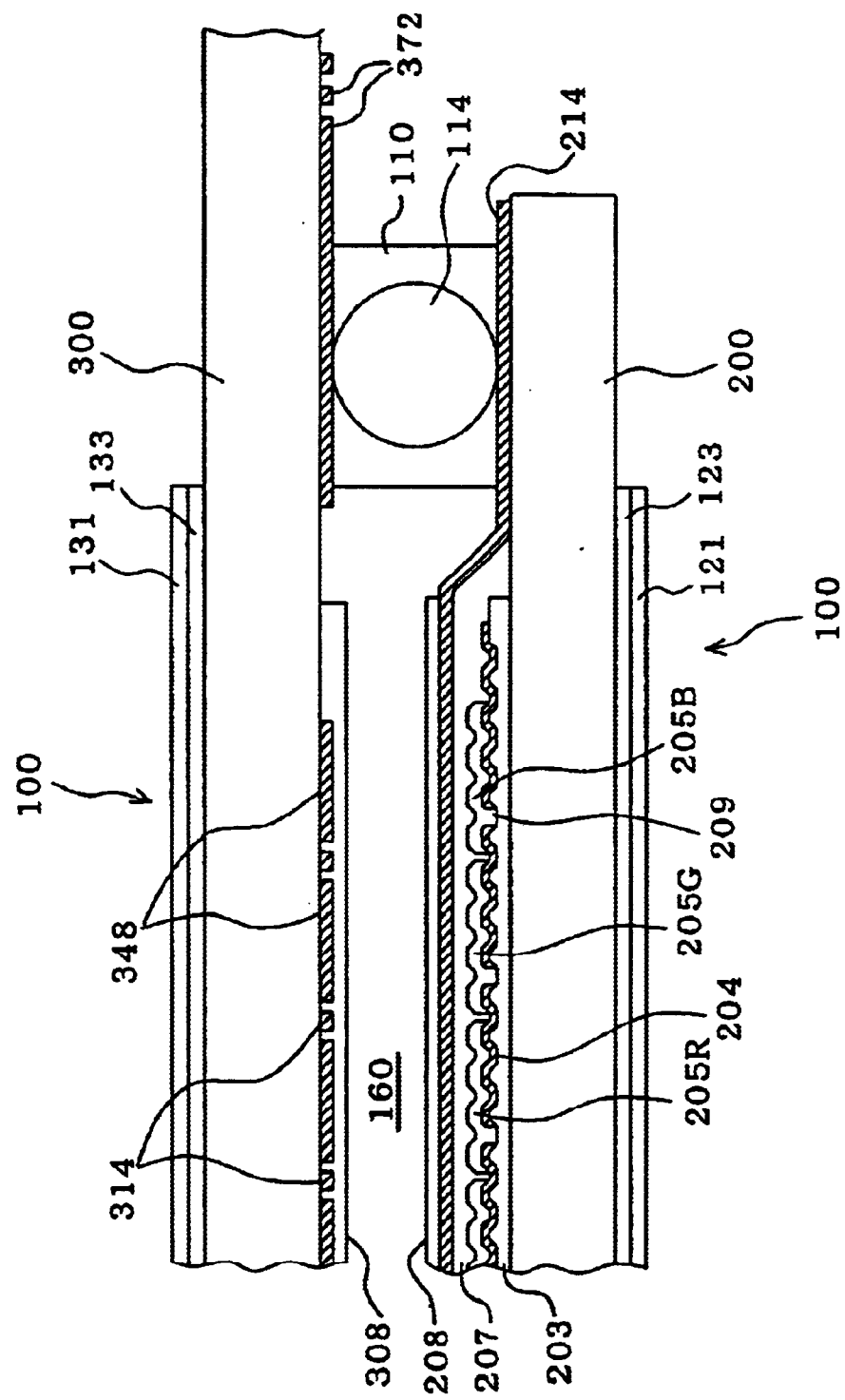
FIG. 4 is a sectional view illustrating the internal structure of the display illustrated in FIG. 2.

The internal structure of the display area of the display 100 is discussed below. Referring to FIG. 4, a retardation plate 133 and a polarizer 131 are attached to the external surface of the TFD substrate 300. The retardation plate 133 and the polarizer 131 are not shown in FIG. 3 for simplicity.

The data lines 314, made of chromium (Cr) or the like, extends in the Y direction (in a direction perpendicular to the page of FIG. 4) on the internal surface of the TFD substrate 300. A rectangular pixel electrode 348, fabricated of an electrically conductive transparent material such as ITO (Indium Tin Oxide), is disposed close to the data line 314.

An alignment layer 308, made of polyimide or the like, is deposited on the surface of the pixel electrode 348. The alignment layer 308 is subjected to a rubbing process in a particular direction prior to the bonding of the TFD substrate 300 to the counter substrate 200. Since the alignment layer 308 is not required outside the display area, the alignment layer 308 is not disposed in the vicinity of and outside forming region of the sealing member 110.

A retardation plate 123 and a polarizer 121 are attached to the external surface of the counter substrate 200. The retardation plate 123 and the polarizer 121 are not shown in FIG. 3.

A scattering resin layer 203 having a rugged surface is disposed on the internal surface of the counter substrate 200. For example, the scattering resin layer 203 is formed by patterning a photoresist in dots on the surface of the counter substrate 200, and then by heating the photoresist dot pattern to soften the edge of each dot pattern.

A reflective layer 204, made of a reflective metal such as aluminum or silver, is deposited on the rugged surface of the scattering resin layer 203. The reflective layer 204 is also ruggedized, conformably reflecting the ruggedness of the scattering resin layer 203. Light entering from the viewer's side is properly scattered when being reflected from the reflective layer 204.

For the display 100 to function not only as a reflective type but also a transmissive type, the reflective layer 204 has apertures 209 to allow light to pass therethrough. Rather than opening the apertures 209, relatively thin metal layer (having a thickness within a range from 20 nm to 50 nm) having light reflectance, for example, of aluminum may be deposited so that a portion of light entering from behind may be transmitted therethrough.

A red color filter 205R, a green color filter 205G, and a blue color filter 205B in a predetermined order are arranged on the surface of the reflective layer 204 in a region where the pixel electrode 348 faces the scanning line 214. The color filters 205R, 205G, and 205B are arranged in a striped configuration appropriate for data handling in this embodiment.

A flattening layer 207 made of an insulating material is disposed on the surfaces of the color filters 205R, 205G, and 205B so as to make steps of the color filters and undulation of the reflective layer 204 to be flat. The scanning lines 214 made of an electrically conductive transparent material such as ITO are arranged on the surface flattened by the flattening layer 207, extending in the X direction (in a direction from the right to the left on the page of FIG. 4, so as to face the pixel electrodes 348 formed on the TFD substrate 300.

An alignment layer 208 made of polyimide is formed on the surface of the scanning lines 214. The alignment layer 208 is subjected to a rubbing process in a predetermined direction prior to the bonding with the TFD substrate 300. Since the color filters 205R, 205G, and 205B, the flattening layer 207, and the alignment layer 208 are not required outside the display area, these layers are not disposed in the vicinity of and outside the sealing member 110.

Figure 5:
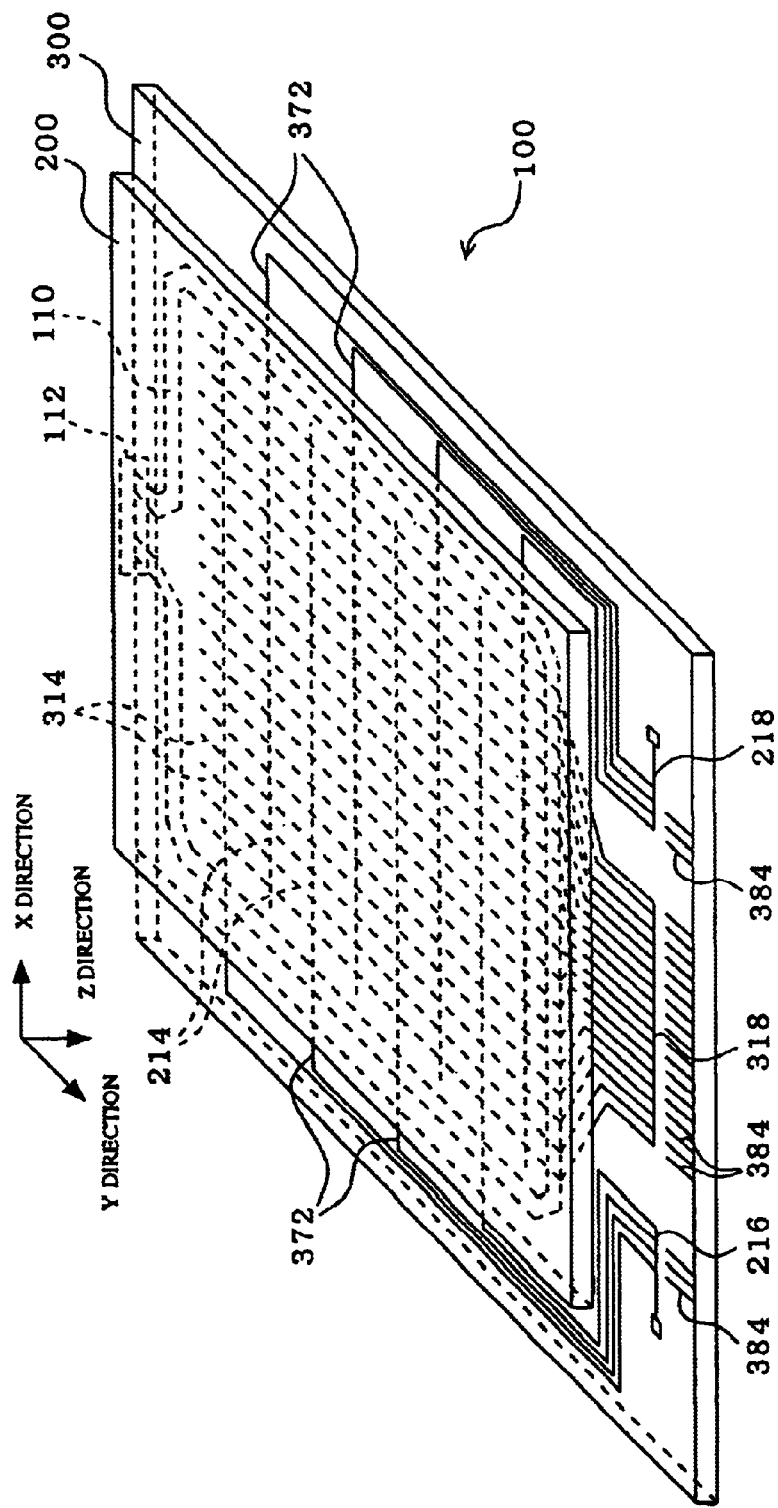
FIG. 5 is an external perspective view of the display before cutting electrical wiring lines and mounting a driver IC.

FIG. 5 is a perspective view illustrating the display 100 prior to the mounting of the Y drivers 251 and 253, and the X driver 350, and prior to the connecting of the flexible connector 150. As shown, the other ends of the wiring lines 372 respectively connected to the odd-numbered scanning lines 214 are shorted together by a shorting line 216. Similarly, the other ends of the wiring lines 372 respectively connected to the even-numbered scanning lines 214 are shorted together by a shorting line 218. Furthermore, all data lines 314 are shorted by a shorting line 318.

The shorting lines 216, 218, and 318 are produced in the same step as the wiring lines 372 and the data lines 314. Subsequent to inspection, the shorting lines 216 and 218 are electrically disconnected from the wiring lines 372, and the shorting line 318 is also electrically disconnected from the data lines 314.

Figure 6:
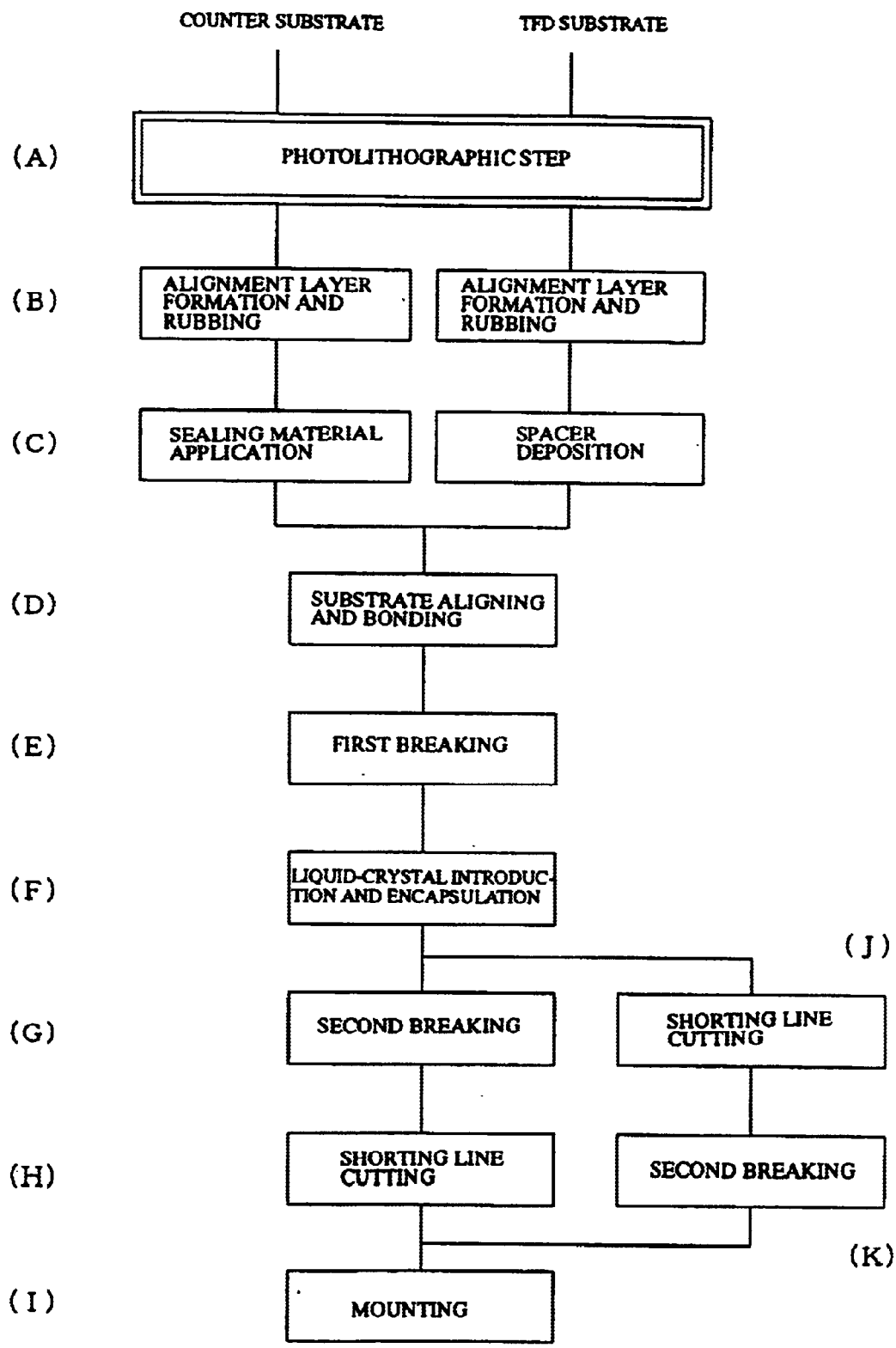
FIG. 6 is a flow diagram illustrating a manufacturing process of the display illustrated in FIG. 2.
Figure 7:
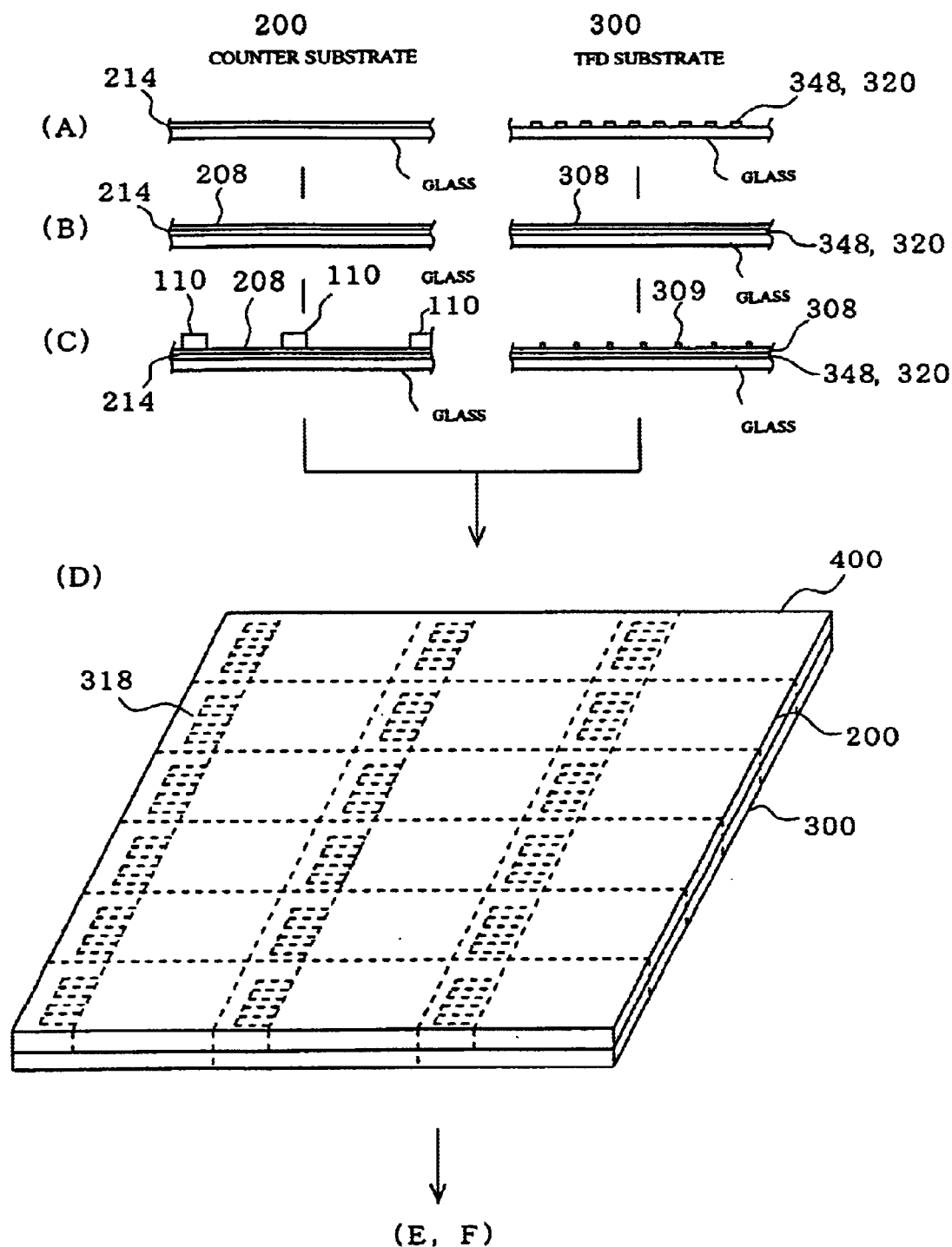
FIG. 7 is a process chart of the display corresponding to the flow diagram illustrated in FIG. 6.
Figure 8:
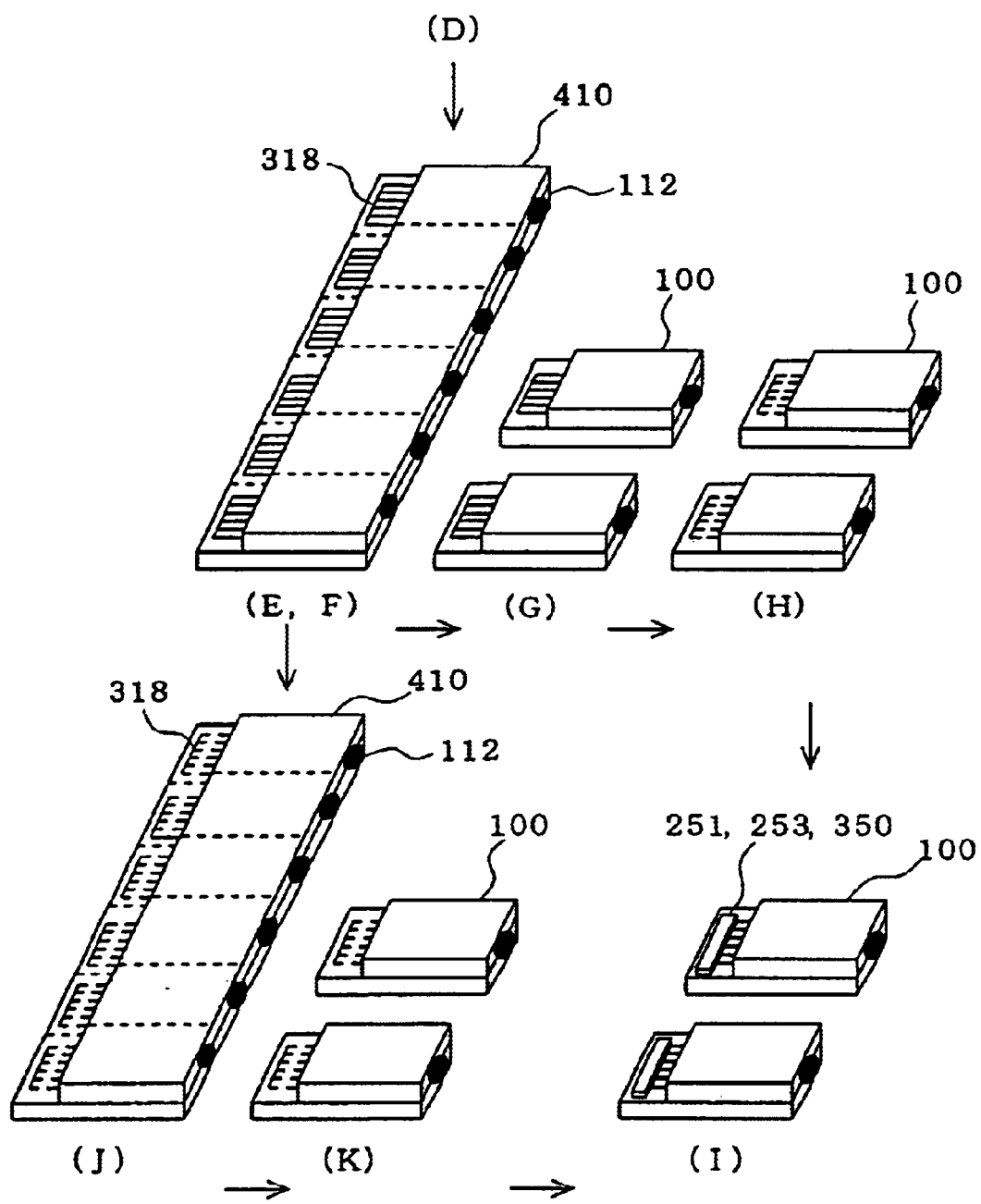
FIG. 8 is a continuation of the process chart of FIG. 7 corresponding to the flow diagram of FIG. 6.

The manufacturing process of the display 100 will now be discussed with reference to a flow diagram illustrated in FIG. 6 and process diagrams illustrated in FIG. 7 and FIG. 8. Steps (A)–(I) in FIG. 6 respectively correspond to steps (A)–(I) in FIGS. 7 and 8.

(A) In a photolithographic step (an element formation step), the scanning lines 214 as a common electrode are formed on the counter substrate 200 made of glass, and the pixel electrodes 348 and the TFDs 320 as a switching element are formed on the TFD substrate 300 made of glass. The shorting lines for preventing static breakdown are formed on an area which later becomes the extension area 302 of the TFD substrate 300 as shown in FIG. 5. The electrodes, elements, etc. produced in the photolithographic step are different depending on the type of the display 100.

(B) The alignment layer 208 is disposed on the counter substrate 200 and is then subjected to a rubbing process. Likewise, the alignment layer 308 is disposed on the TFD substrate 300 and is then subjected to a rubbing process.

(C) The sealing member 110 is applied on one of the substrates, for example, on the counter substrate 200 to encapsulate the liquid crystal. A spacer material 309 is dispersed on the alignment layer 308 of the other of the substrates, for example, the TFD substrate 300. The application of the sealing member and the spacer material is not limited this method. Alternatively, both the sealing member and the spacer material may be applied to one substrate.

(D) The two substrates 200 and 300 produced in the above steps (A) to (C) are aligned and bonded together to form a single large panel 400. For convenience, the shorting line 318 only is shown here.

(E) In a first break process, the panel 400 is diced into rectangular panels 410. A portion of the counter substrate 200 corresponding to the extension area 302 of the TFD substrate 300 is also broken away. In the break process, a scribe line (represented by dotted lines) is scribed along a break line of the panel 400, and a flexural stress is applied there to break it.

(F) The liquid crystal is introduced through a liquid-crystal inlet port into the rectangular panel 410, and the inlet port is then closed with the seal material 112.

(G) In a second break process, the rectangular panel 410 with the liquid crystal encapsulated therewithin is diced into displays 100, each of which has a single product size.

(H) The electrical wiring lines (the above-referenced wiring lines 372 and data lines 314), formed on the TFD substrate 300 and shorted by the shorting line 318, etc., are irradiated with the branch beams for cutting. The wiring lines are thus isolated from each other.

(I) The Y drivers 251 and 253 and the X driver 350 are mounted on the extension area 302 of the TFD substrate 300 using a driver IC mounter. The flexible connector 150 is then mated with the TFD substrate 300.

Steps (G) and (H) may be reversed in order. In that case, the order of steps is (F)–(J)–(K)–(I).

Figure 9:
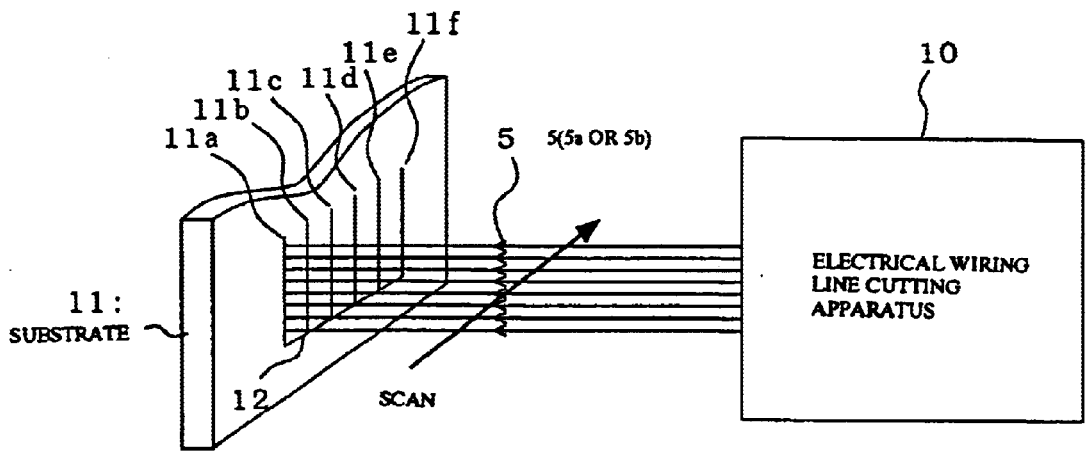
FIG. 9 is a diagram illustrating a manner in which the laser cutting apparatus illustrated in FIG. 1 is used to cut the electrical wiring lines.

The cutting method of cutting the a plurality of electrical wiring lines shorted on the TFD substrate 300 with the laser cutting apparatus 10, corresponding to step (H) or (J), is discussed below. Referring to FIG. 9, there are shown a substrate 11, electrical wiring lines 11a–11f, and a shorting line 12.

FIG. 9 illustrates the laser cutting apparatus 10 in FIG. 1 used to cut the electrical wiring lines. The laser cutting apparatus 10 emits a plurality of branch beams 5 (5a or 5b), and condenses the beams 5 on the substrate 11 having a plurality of wiring lines 11a–11f and the shorting line 12 shoring these wiring lines. Moving the branch beams 5 in a direction represented by an arrow, the laser cutting apparatus 10 cuts the electrical wiring lines 11a–11f at a plurality of locations. Instead of moving the branch beams 5, the substrate 11 may be laterally moved to cut the electrical wiring lines 11a–11f. Each wiring line is cut at a plurality of locations. With the branch beams 5 or the substrate 11 moved, remaining electrical wiring lines are also cut. Isolation between the electrical wiring lines 11a–11f is reliably accomplished within a short period of time. The alignment of the branch beams is easier than when the shorting line 12 is cut from each of the electrical wiring lines 11a–11f for line isolation.

Figure 10:
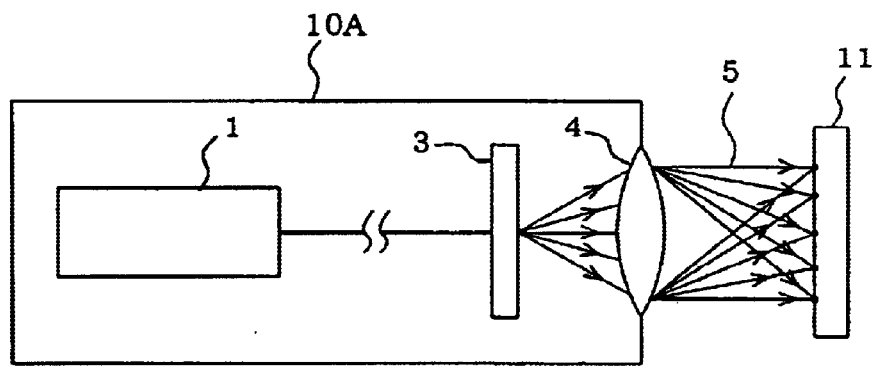
FIG. 10 illustrates the operation of the laser cutting apparatus of another embodiment of the present invention.

FIG. 10 illustrates the operation of the laser cutting apparatus 10A of another embodiment of the present invention. The laser cutting apparatus 10A condenses each of a plurality of branch beams, branched by the beam branching element 3, on the surface of the substrate 11 through a condenser lens 4. The remaining construction of the laser cutting apparatus 10A is identical to that of the laser cutting apparatus 10.

Figure 11:
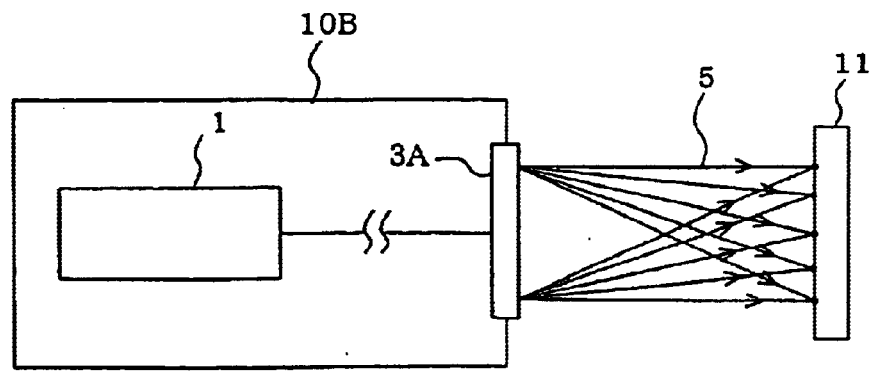
FIG. 11 illustrates the operation of the laser cutting apparatus of yet another embodiment of the present invention.

FIG. 11 illustrates the operation of the laser cutting apparatus 10B of yet another embodiment of the present invention. The laser cutting apparatus 10B includes a Fresnel-type phase grating 3A which branches the laser beam into branch beams and then condenses the branch beams. The remaining construction of the laser cutting apparatus 10B is generally identical to that of the laser cutting apparatus 10.

The electrical wiring lines are irradiated with the branch beams in the following two methods.

Figure 12:
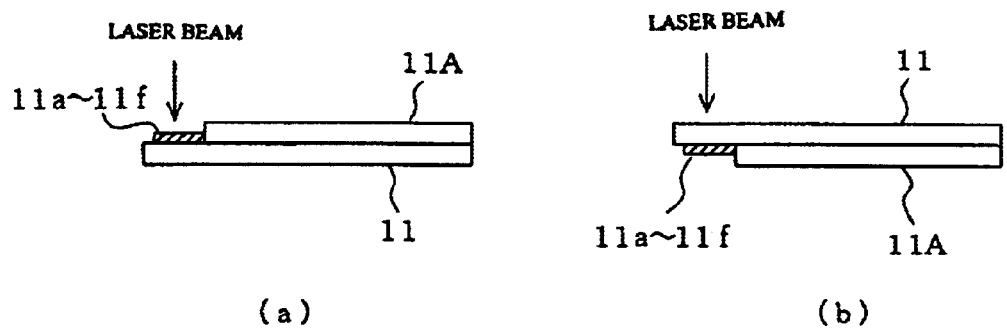
FIGS. 12A and 12B illustrate the method of directing branch beams to the electrical wiring lines.

Referring to FIG. 12A, the branch beams are directed to the electrical wiring lines 11a–11f from the side of the wiring surface of the substrate 11 on which the wiring lines are formed.

If the substrate 11 has a transparency to the laser, the branch beams may be directed to the electrical wiring lines 11a–11f from the opposite side to the wiring surface of the substrate as shown in FIG. 12B. Experiments show that if the laser beam is directed through a glass substrate to the electrical wiring line from behind the glass substrate, the electrical wiring line is cut with a lower power (particularly when the shorting line is made of Cr, half the power required to cut the electrical wiring lines. This method also substantially reduces the generation of dross and debris. This method is applicable to a silicon substrate if an infrared light laser is used. When the cutting method of directing the laser beam to the electrical wiring line from the opposite side to the wiring surface of the substrate bearing the electrical wiring lines, experiments show that the generation of dross and debris is further reduced if the electrical wiring lines are formed on a transparent layer such as an ITO layer or a tantalum pentoxide layer. This method is applicable to cut an electrical wiring line disposed between a plurality of substrates.

The test of cutting a number of sample electrical wiring lines with the laser cutting apparatus 10 shows that cut lines were successfully isolated from each other.

Test conditions are as follows:

Laser head size: 500 mm wide, 160 mm long, and 32 mm high

Laser wavelength: 532 nm

Condenser lens: focal length 100 mm

Laser output power: 300 mW (when the laser is directed to the electrical wiring line from the side bearing the electrical wiring lines), 150 mW (when the laser is directed to the electrical wiring line from the opposite side to the surface bearing the electrical wiring lines)

Laser oscillation rate: 20 kHz

Number of branches: 6

Cutting process rate: 100 mm/s

Electrical wiring lines: made of chromium

There is no particular limitation on the number of branch beams applied to the electrical wiring lines. However, to assure isolation, the number of branch beams is preferably five to eight beams.

Figure 13:
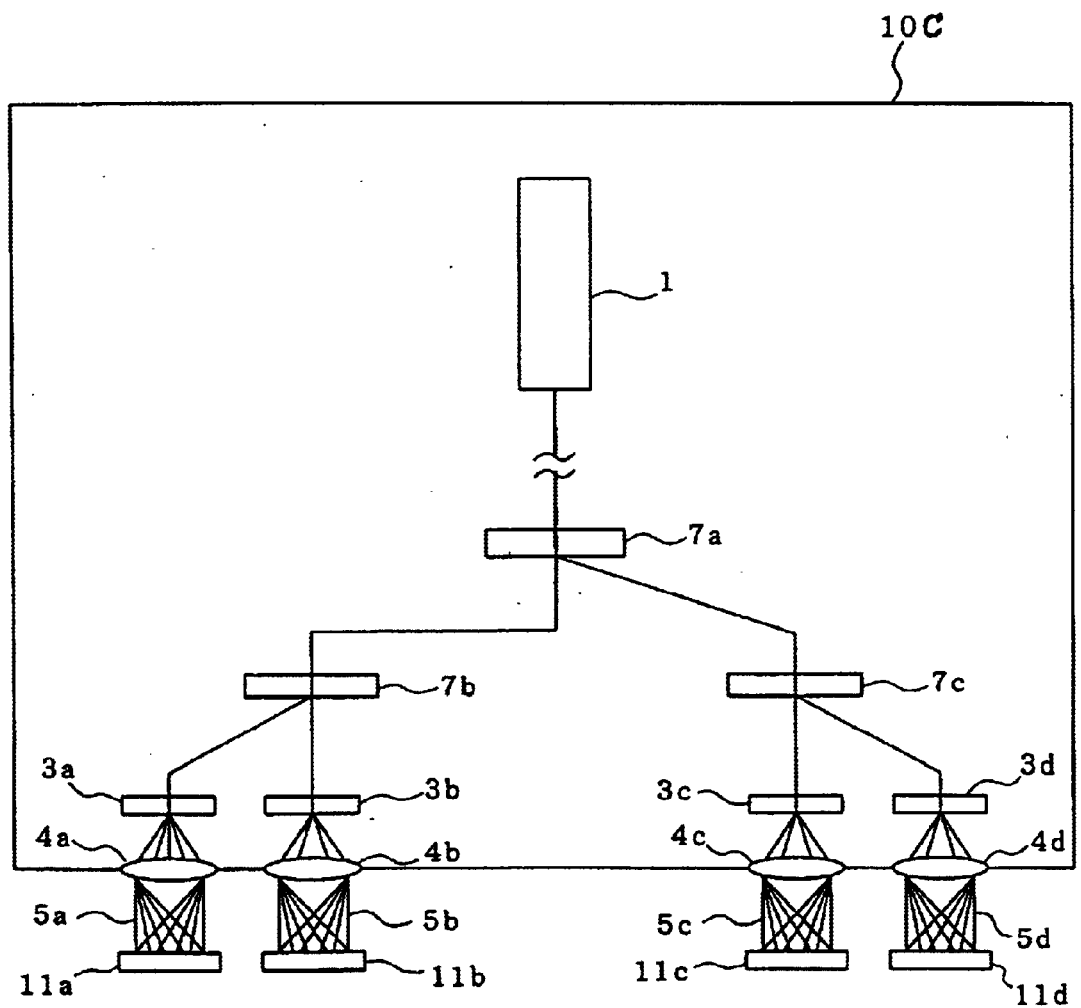
FIG. 13 illustrates the operation of the laser cutting apparatus of a further embodiment of the present invention.

FIG. 13 illustrates the operation of the laser cutting apparatus 10C of a further embodiment of the present invention. A major difference between the laser cutting apparatus 10 illustrated in FIG. 1 and the laser cutting apparatus 10C is that the laser cutting apparatus 10C has a cutting process rate twice as high as that of the laser cutting apparatus 10. Specifically, in the laser cutting apparatus 10C, a single laser beam output from a laser generator 1 is split into four beams by beam splitters 7a–7c, and the respective four split beams are branched into a plurality of branch beams by beam branching elements 3a–3d. Therefore, electrical wiring lines formed on four substrates 11a–11d are concurrently cut.

Like the laser cutting apparatus 10, the laser cutting apparatus 10C can adjust the power of the beams by combining the beam splitters 7a–7c with the variable retardation plate, and adjust the focal depth by arranging a beam diameter adjusting expander in the optical path prior to beam condensing.

The operational examples of the laser cutting apparatuses 10, and 10A–10C are discussed below with reference to FIGS. 14 and 15.

Figure 14:
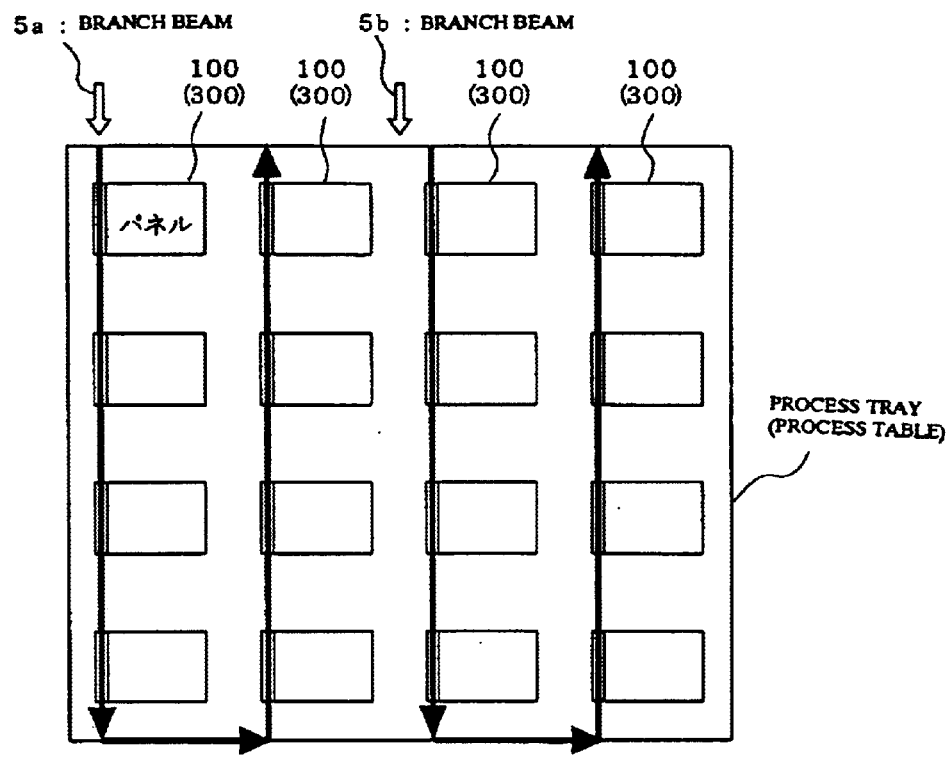
FIG. 14 illustrates scanning lines of laser beams for cutting an electrical-wiring-lines on individual displays set in a process tray.

FIG. 14 illustrates individual displays set in a process tray. As shown, the branch beams are moved along a scan line to cut a plurality of electrical wiring lines connected to a shorting line, thereby cutting the shorting line from the electrical wiring lines to isolate one line from another. In this example, sixteen displays 100 (four rows by four columns) in the manufacturing process are set in the process tray. The branch beams 5a and 5b are moved in a direction represented by an arrow as shown in FIG. 14, thereby cutting each electrical wiring line on a TFD substrate 300 forming the display 100 so as to isolate it from the other electrical wiring lines.

Figure 15:
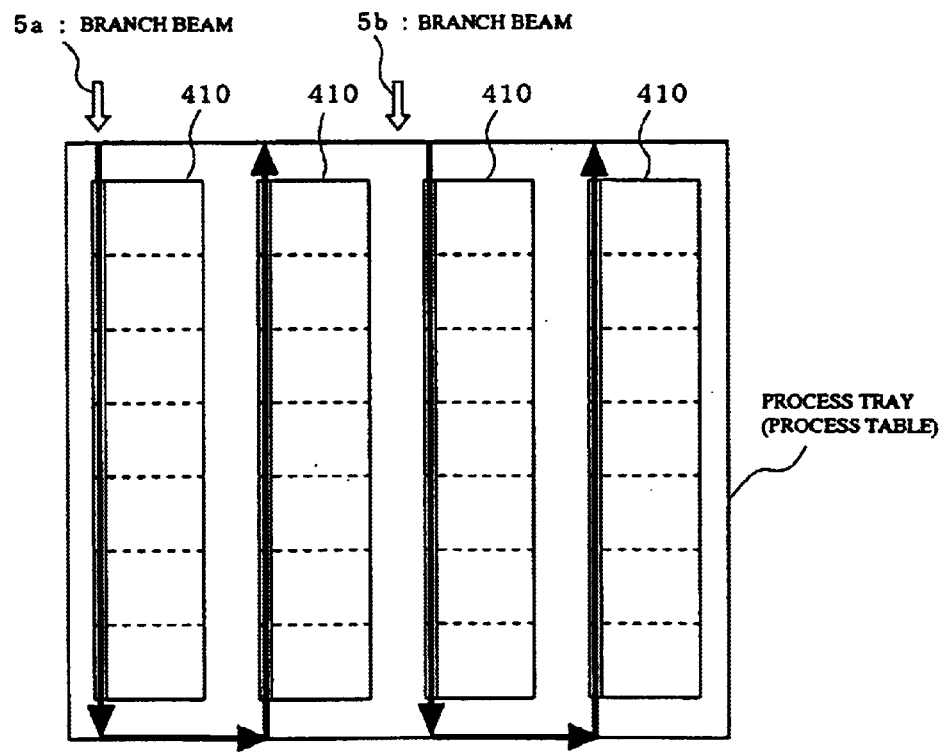
FIG. 15 illustrates the scanning lines of laser beams for cutting an electrical-wiring-lines on rectangular panels of displays prior to a second break operation.

FIG. 15 illustrates rectangular panels prior to a second break operation. As shown, the branch beams are moved along a scan line to cut a plurality of electrical wiring lines connected to a shorting line, thereby cutting the electrical wiring lines to isolate one line from another. In this example, four rectangular panels 410 (each panel includes six to eight individual displays) are set in the process tray. The branch beams 5a and 5b are moved in a direction represented by an arrow as shown in FIG. 15, thereby cutting each electrical wiring line to isolate it from the other electrical wiring lines.

In accordance with these cutting process methods, the branch beams are easily moved with respect to the display devices 100, and the efficiency of the cutting process is heightened.

The branch beams 5c and 5d, which are not shown in FIGS. 14 and 15, work in the same manner as the branch beams 5a and 5b.

Figure 16:
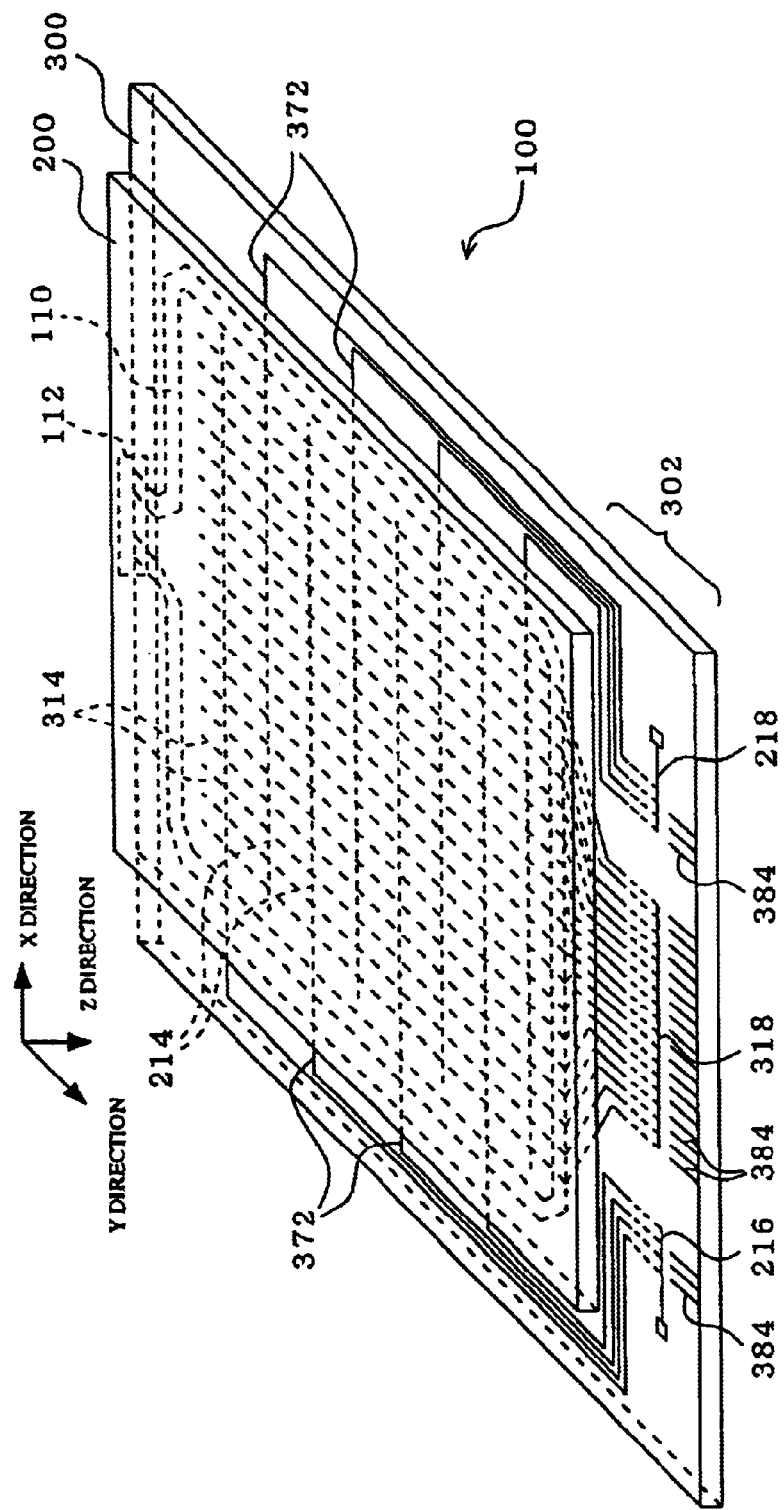
FIG. 16 is an external view of a display subsequent to the cutting of the electrical wiring lines and prior to the mounting of the driver IC.

FIG. 16 is an external view of a display in which linear portions of the wiring lines 314 and 372 on the extension area 302 of the TFD substrate 300 which have been cut by the laser cutting apparatus 10. The plurality of electrical wiring lines 372 shorted by the shorting line 216, the plurality of electrical wiring lines (data lines) 314 shorted by the shorting line 318, and the plurality of electrical wiring lines 372 shorted by the shorting line 218 have been cut at a plurality of locations thereof for isolation.

When the electrical wiring lines to be cut and the branch beams are relatively moved from each other, the direction of the relative movement may be optional. From the standpoint of workability, the branch beams preferably move in perpendicular to the electrical wiring lines.

The angle made between the direction of the row of beams and the direction of extension of the electrical wiring lines may be slant.

For example, if the direction of the row of branch beams 5 is in parallel with the direction of the linear portions of the electrical wiring lines 11a–11f, the cutting process is performed in accordance with the number of branch beams.

Figure 18:
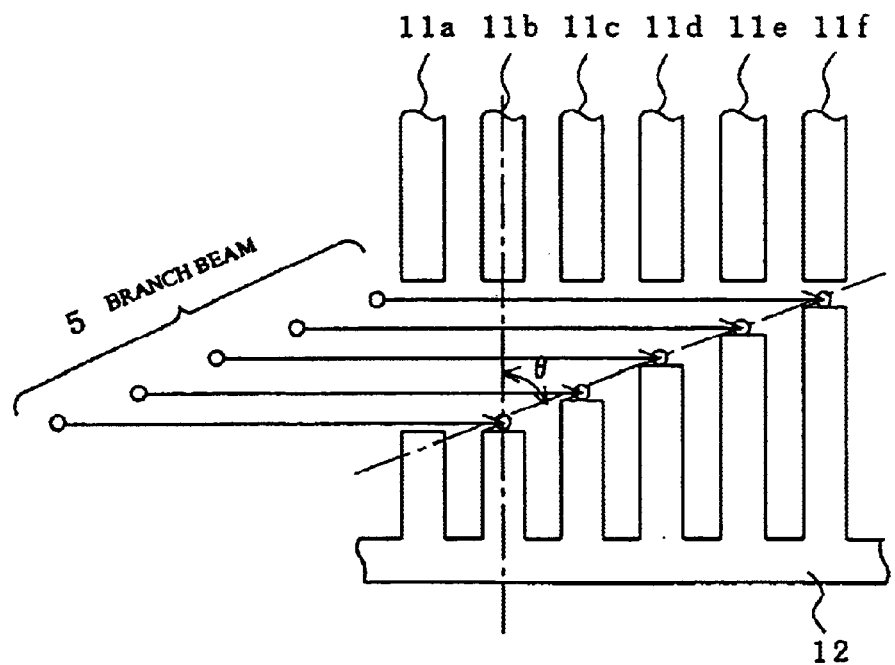
FIG. 18 illustrates a cutting operation of the laser cutting apparatus in which the branch beams relatively moves in perpendicular to the electrical wiring line, wherein the direction of the row of branch beams crosses the direction of extension of the electrical wiring lines.

In contrast, it is also possible to set the direction of the row of branch beams 5 to be in non-parallel with the direction of the linear portions of the electrical wiring lines 11a–11f. The cutting intervals of the electrical wiring lines 11a–11f becomes smaller depending on a slant angle θ made between the direction of the row of branch beams 5 and the direction of the linear portions of the electrical wiring lines 11a–11f. The cut portions merge together at a plurality of cut locations on a single electrical wiring line. Referring to FIG. 18, a wide cut portion results. In accordance with the cutting method illustrated in FIG. 18, an overall cut portion is generally narrowed, and lifted sections of each line arising from the laser cutting are limited to the two ends of the wide cut portion. If the slant angle θ is set to be closer to 90 degrees, the resulting cut shape becomes identical to that resulting from a laser cutting using a single laser beam which is not branched at all. The slant angle θ is thus set to be any angle within a range equal to or greater than zero degree and smaller than 90 degrees.

Figure 17:
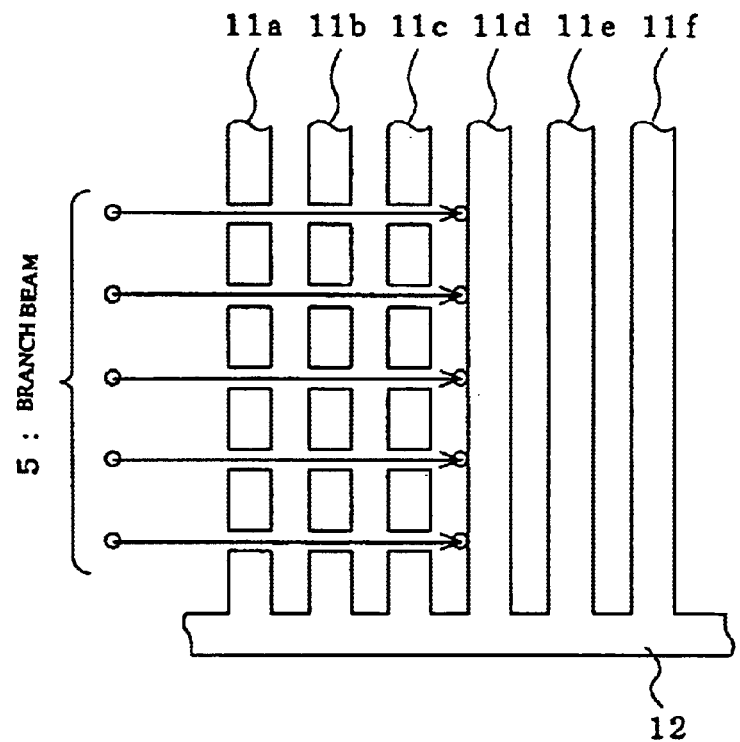
FIG. 17 illustrates a cutting operation of the laser cutting apparatus in which the branch beams relatively moves in perpendicular to the electrical wiring lines, wherein the direction of the row of branch beams is in parallel with the direction of the electrical wiring lines.

FIGS. 17 and 18 illustrate the direction of the row of the branch beams and the direction of movement of the branch beams. The branch beams are directed to the electrical wiring lines 11a–11f in perpendicular to the pages of FIGS. 17 and 18.

Since the electrical wiring lines are cut using the laser cutting apparatus described above, a single electrical wiring line is cut at a plurality of locations, or in a wide area, so that each wiring line is reliably isolated from the rest of the wiring lines.

Since the branch beams are relatively moved with respect to the substrate having the electrical wiring lines formed thereon, by moving the branch beams or the substrate, to cut the electrical wiring lines, the isolation between the electrical wiring lines is reliably assured by one pass of the laser branch beams (in a short period of time). The cutting process efficiency is heightened.

Since the optical system constituting the laser cutting apparatus is made simple and compact, the laser cutting apparatus can be incorporated in an apparatus for manufacturing electronic equipment.

In the above-referenced embodiments, the laser cutting apparatus cuts the electrical wiring lines on the TFD liquid-crystal display using the TFD as a switching element so as to isolate the lines from each other. The present invention may be applied to a TFT liquid-crystal display using a TFT (Thin-Film Transistor) as a switching element. The method and apparatus of the present invention may be applied to not only a transflective-type display but also a transmission-type display and a reflection-type display.

The method and apparatus of the present invention may be applied not only to the manufacturing process of the liquid-crystal display of the above-referenced embodiment, but also to a manufacturing process of a variety of electronic devices which includes a step in which a plurality of electrical wiring lines shorted beforehand are later isolated from each other. Such devices may include an organic EL display, a plasma display, or other semiconductor devices.

Figure 19:
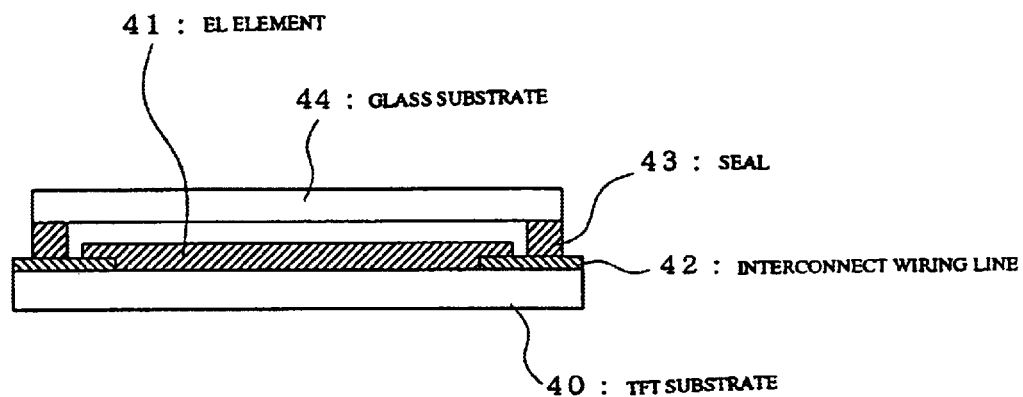
FIG. 19 illustrates a panel structure of a TFT polymer EL display.

FIG. 19 shows the construction of a TFT polymer EL display comprising a TFT substrate 40 having a TFT switching element (not shown) and an EL element 41, an interconnect wiring line 42 made of ITO, a seal 43, a glass substrate 44, etc. Predetermined wiring lines formed on the TFT substrate 40 are typically shorted by a shorting line. In the manufacturing process of the TFT substrate 40, the method and apparatus of the present invention may be used to cut the electrical wiring lines to isolate one line from another.

Figure 20:
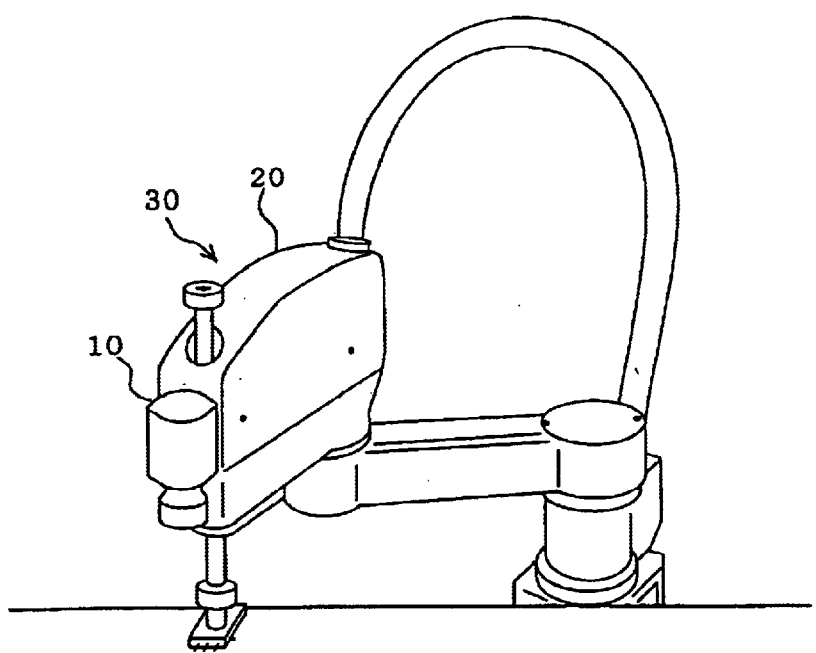
FIG. 20 is a perspective view illustrating an IC mounter including the laser cutting apparatus.

If a compact LD laser device is used as an oscillator for the laser generator in the laser cutting apparatus, a compact laser system having a simple optical system can be obtained. Since a laser cutting apparatus may be incorporated in an apparatus for manufacturing a display device such as a liquid-crystal display, an organic EL display, or a plasma display, or in an apparatus for manufacturing a semiconductor device. An apparatus for manufacturing a variety of electronic devices may be produced. For example, referring to FIG. 20, one of the laser cutting apparatuses 10, 10A–10C may be incorporated in an IC mounter 20 for mounting a driver IC on a TFD substrate, so that an apparatus 30 for manufacturing a display is thus produced.

The display device such as the liquid-crystal display or the organic EL display produced by the method and apparatus of the present invention is applied in a variety of mobile devices, such as a notebook computer, a PDA (Personal Digital Assistant), a video telephone, a mobile telephone, a digital camera, a video camera, a car navigation system. The present invention substantially contributes to the production of these devices.

What is claimed is:

1. A method of cutting an electrical wiring line on a substrate, comprising the steps of branching a laser beam into a plurality of branch beams, and directing the plurality of branch beams to the electrical wiring line on the substrate to concurrently cut the electrical wiring line at a plurality of locations.

2. A method according to claim 1, wherein the electrical wiring line is cut by relatively moving the substrate and the plurality of branch beams with respect to each other.

3. A method according to claim 2, wherein the plurality of branch beams are moved relatively with respect to and perpendicularly to the electrical wiring line.

4. A method according to claim 2, wherein an angle θ falls within a range equal to or greater than zero degree and smaller than 90 degrees where the angle θ is formed between a direction of the row of the plurality of branch beams and a direction of the electrical wiring line.

5. A method according to claim 1, wherein the branch beams are directed to the electrical wiring line on the substrate from the side of a surface thereof having the electrical wiring line.

6. A method according to claim 1, wherein the branch beams are directed to the electrical wiring line through the substrate from the opposite side to the surface having the electrical wiring line.

7. A method according to claim 1, wherein the branch beams are directed to the electrical wiring line through the substrate when the electrical wiring line is disposed between a plurality of substrates.

8. A method according to claim 1, wherein debris resulting from cutting of the electrical wiring line is sucked in while the electrical wiring line is cut.

9. A method according to claim 1, wherein a laser beam in the infrared light region is used for said laser beam.

10. A method according to claim 1, wherein the laser beam is generated by a solid-state laser device.

11. A method according to claim 10, wherein a harmonic oscillation of the solid-state laser is used.

12. A method according to claim 1, wherein the laser beam is generated by a gas laser device.

13. A method according to claim 1, wherein the laser beam is generated by a metal vapor laser device.

14. A method according to claim 1, wherein the atmosphere for a cutting process has a pressure lower than the atmospheric pressure.

15. A method according to claim 1, wherein the atmosphere for a cutting process contains no oxygen.

16. A method according to claim 15, wherein the atmosphere for a cutting process contains nitrogen.

17. A method according to claim 15, wherein the atmosphere for a cutting process contains a noble gas.

18. A method according to claim 1, the substrate has a transparency to the laser beam.

19. A method according to claim 18, wherein the substrate is made of glass or silicon.

20. A method according to claim 1, wherein a portion of the electrical wiring line to be cut linearly extends.

21. A method according to claim 1, wherein when electrical wiring lines formed on the substrates of a plurality of electronic devices are cut, the plurality of electronic devices axe juxtaposed to each other so that cut ends of the electrical wiring lines of the respective electronic devices are aligned in a line.

22. A method according to claim 1, wherein the electrical wiring line is formed on a transparent layer.

23. A method according to claim 22, wherein the transparent layer is made of ITO or tantalum pentoxide.

24. A method according to claim 1, wherein the electrical wiring line is made of chromium or ITO.

25. A method for manufacturing an electronic device having a substrate on which a plurality of electrical wiring lines are formed, the method comprising a step of isolating each of the electrical wiring lines from another by cutting the electrical wiring lines, wherein the electrical wiring lines are cut using a method according to claim 1.

26. A method according to claim 25, wherein an IC to be connected to the electrical wiring lines is mounted on the substrate subsequent to the cutting of the electrical wiring lines.

27. A method according to claim 25, wherein the electronic device is a display.

* * * * *